United States Patent

Dahl et al.

[11] Patent Number: 5,912,803
[45] Date of Patent: Jun. 15, 1999

[54] HEAT DISSIPATING BOX

[75] Inventors: Uno Dahl, Häersten; Göte Johannison, Rönninge; Lars Nygren, Tumba; Johan Karlsson, Bagarmossen, all of Sweden

[73] Assignee: Telefonaktiebolaget LM Ericsson, Stockholm, Sweden

[21] Appl. No.: 09/035,939

[22] Filed: Mar. 6, 1998

[30] Foreign Application Priority Data

Mar. 7, 1987 [EP] European Pat. Off. .............. 97850035

[51] Int. Cl.⁶ ....................................... H05K 7/20
[52] U.S. Cl. .......................... 361/704; 361/705; 361/715; 361/818; 165/80.3; 165/46; 165/185; 174/52.1; 174/252; 174/35 R; 257/713; 257/721
[58] Field of Search ..................... 361/683, 685, 361/687, 600, 690–697, 700–721, 752, 818, 820, 775; 165/80.3, 80.4, 104.26, 46, 185, 104.33; 174/35 R, 52.2, 52.3, 252, 52.1; 29/827, 840; 257/713, 715–723, 765

[56] References Cited

U.S. PATENT DOCUMENTS

| 4,371,757 | 2/1983 | Debortoli et al. . | |
| 4,535,386 | 8/1985 | Frey, Jr. et al. . | |
| 4,661,888 | 4/1987 | Jewell et al. . | |
| 4,716,498 | 12/1987 | Ellis | 361/715 |
| 4,771,365 | 9/1988 | Cichoki et al. | 361/705 |
| 4,794,487 | 12/1988 | Maschek et al. . | |
| 5,243,493 | 9/1993 | Jeng et al. . | |
| 5,552,961 | 9/1996 | Van Gaal et al. . | |

FOREIGN PATENT DOCUMENTS

0681422-A2  11/1995  European Pat. Off. .
3829649-A1  3/1990  Germany .

Primary Examiner—Leo P. Picard
Assistant Examiner—Michael Datskovsky

[57] ABSTRACT

The present invention relates to a heat dissipating box for a printed board assembly (PBA) using natural convection for cooling. The PBA 64 is fastened between a first part 62 and a second part 61 and the joint is sealed with an elastic material 71. A back plane, which has an opening for a connector of the PBA, is mounted to the other two parts to prevent undesirable substances to get inside the box. The heat dissipating property of the PBA, mounted inside a box, increases rapidly if the PBA's heat dissipating components are placed near or in good thermal contact with the box. This can be obtained by placing bumps, for example supports 66, 68 or ridges 65, on the inside of the box, which are in close contact with the PBA. The surface area of the box may also be enlarged with cooling fins.

20 Claims, 5 Drawing Sheets

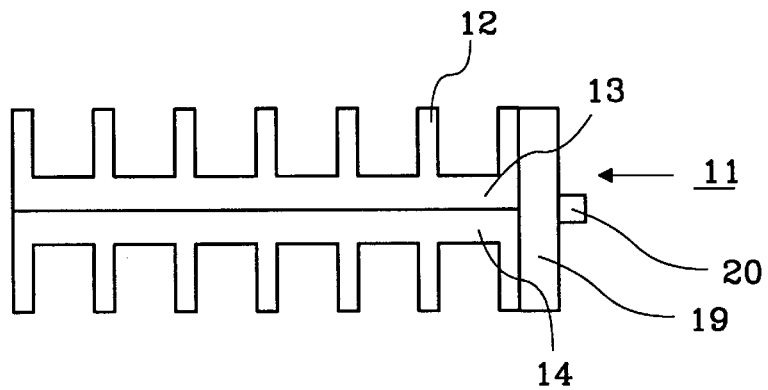
Fig 2a
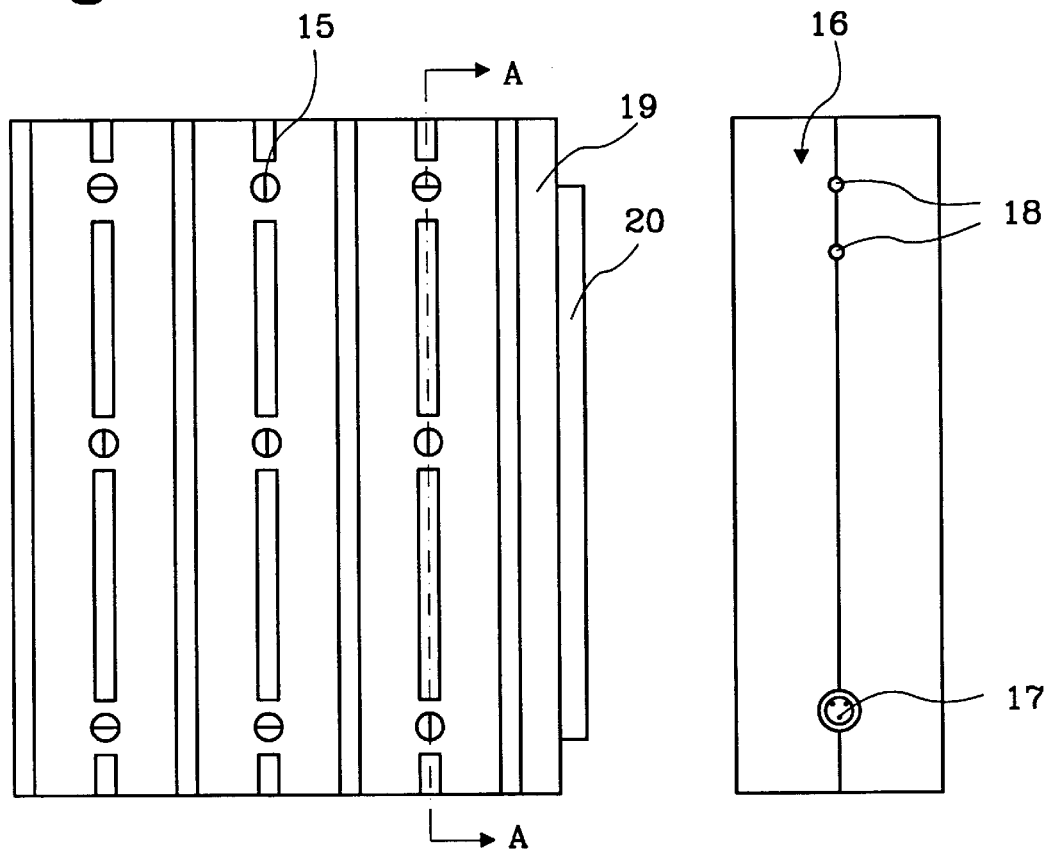
Fig. 2b
Fig 2c

HEAT DISSIPATING BOX

TECHNICAL FIELD

The present invention relates to a heat dissipating box for a printed board assembly (PBA) using natural convection for cooling.

PRIOR ART

Electronic equipment generally uses one or more fans to cool it down to a reasonable level. When mounting such equipment in an area, where there is a desire to cool the equipment without using a fan, the cooling can be achieved by utilising natural convection.

A normal way of mounting printed circuit boards in an electronic equipment, using natural convection, is to avoid encapsulation for maximum exposure of the heat dissipating components mounted on a heat sink. The printed circuit boards are then mounted vertically and parallel to each other to increase the flow of cooling air between them. The U.S. Pat. No. 5,243,493 by Jeng et al describes this for cooling of a personal computer using natural convection.

There are a number of useful areas where cooling preferably is performed by natural convection and one area is cooling of outdoor assemblies, which are dissipating heat in some way. Such a design is described in the U.S. Pat. No. 4,371,757 by Debortoli et al. and comprises an enclosure for outdoor cross-connect in a telecommunication system including ventilation louvers for maintaining the temperature and humidity conditions inside the enclosure substantially the same as outside avoiding condensation and the like.

A similar device is described in the U.S. Pat. No. 4,794,487 by Maschek et al., where an electronic device is protected from heat radiation from the outside, for example solar rays. The purpose is to prevent the electronic device to be heated up inside the device using upper and lower ventilation slots and achieving natural convection by a chimney effect.

An enclosure for cooling electronic components is described in the U.S. Pat. No. 4,535,386 by Frey, Jr et al., where the cooling is performed utilising natural convection. The enclosure comprises an inner chimney where the heat dissipating components are mounted at the lower part of said chimney. The heated air rises from the components and is led to a heat exchanger and a natural turbulence is thereby created.

SUMMARY OF THE INVENTION

Mounting of sensitive electronic equipment in a hostile environment, for example outdoors in normal weather conditions, is very difficult. The normal way of protecting the function of a PBA is to enclose it in a box preventing dust and other undesirable substances to reach it. A problem arises when electronic equipment dissipates heat inside the box. Normally this is taken care of by mounting a fan or the like to cool it off, but a fan needs maintenance and power. The preferred way is to utilise natural convection instead of fans, but this is not enough due to the heat build-up inside the box.

An other problem with mounting of electronic equipment in a hostile environment is that the boxes that hold the PBA's have to be easy to manufacture, easy to use and cheap.

The object of the present invention is to provide an improved heat dissipating box for one or more PBA's mounted inside an enclosure and cooled utilising natural convection.

An other object of the present invention is to provide a heat dissipating box that is cheap, easy to manufacture and easy to use.

The present invention solves the problems by introducing an improved box for heat dissipation with a high cooling efficiency, including means for conducting heat from the PBA to the inside of the box.

Most of the heat from a PBA originates from a few numbers of electronic components. The heat dissipating property of the PBA, mounted inside a box, increases rapidly if the heat dissipating components are placed near or in contact with the box. A good thermally contact can be obtained by means of filling the distance between the heat dissipating components on the PBA and the box with for example gap-fillers, which are thermally good conductors. An alternative way of creating means for a good thermal contact is to place bumps, for example supports or ridges, on the inside of the box, which are in close contact with the PBA.

The PBA is placed in the box, which is divided into three parts, a first part, a second part and a back plane. The PBA is fastened between the first part and the second part and the joint is sealed with an elastic material. The back plane has an opening for a connector of the PBA and the back plane is mounted and sealed to the other two parts to prevent undesirable substances to get inside the box. The box can have apertures for electrical connectors and indicators on the front side and the surface area of the box may be enlarged with cooling fins or equal. The gap-fillers can be omitted if the PBA is in good thermal contact, through bumps of any form, with the first and second part of the box.

The present invention has a major advantage in a high cooling efficiency when exposed to cooling by natural convection even though the box is sealed.

Another advantage is that the same type of box may be used for many different types of PBA's with only minor adjustments, which means lower costs and increased flexibility.

A better understanding of the present invention can be obtained when the following detailed description of the preferred embodiments is considered in conjunction with the following drawings.

BRIEF DESCRIPTION OF THE DRAWINGS

FIGS. 2a–2c are different views of a heat dissipating box according to the present invention.

PREFERRED EMBODIMENTS

Figure 1:
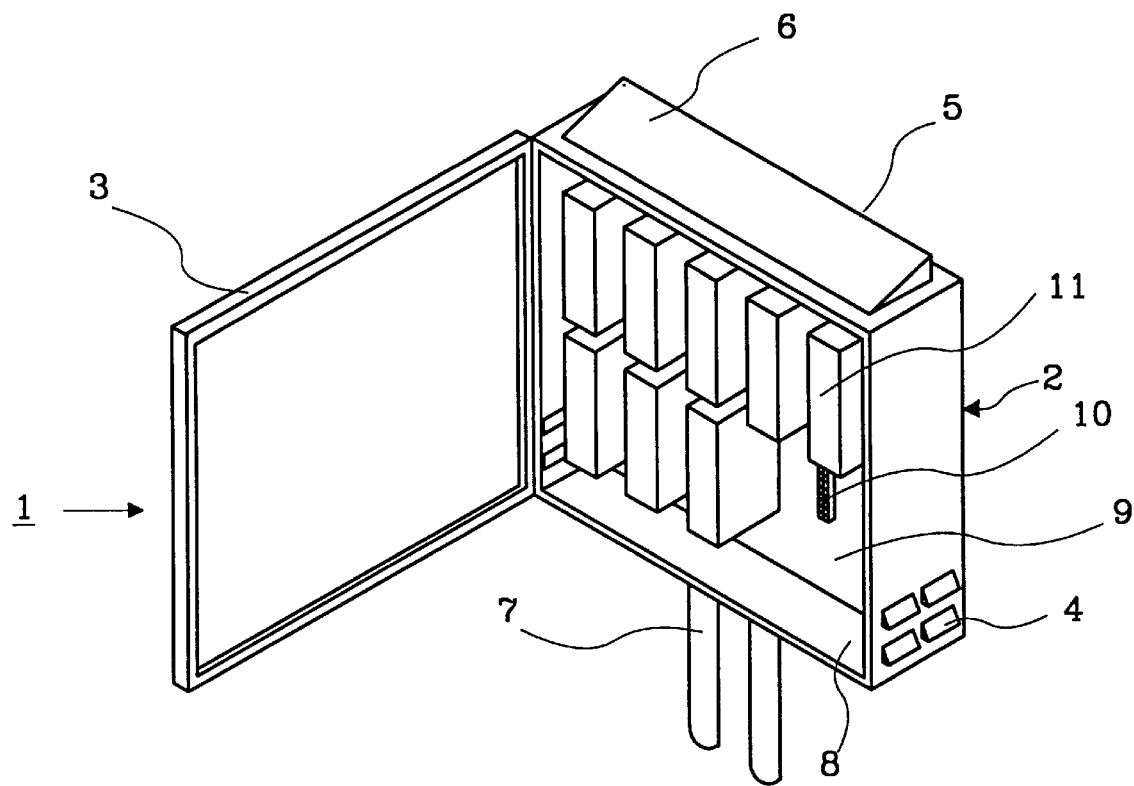
FIG. 1 is a perspective view of an assembly with an enclosure including several boxes according to the present invention with an open door. The assembly is cooled by using natural convection.

FIG. 1 shows a complete assembly 1 comprising an enclosure 2 with an enclosure door 3. The enclosure has several ventilation louvers 4 in the lower part of the enclosure and at least one ventilation slit 5 on the top of the enclosure. The angled top 6 of the enclosure is designed to prevent snow or falling leaves to block the ventilation slit and interrupt the natural convection cooling. The enclosure is divided into two parts by means of a partition wall 9 on which main frame connectors 10 are mounted. Apertures for mounting of cables 7 are provided in the base 8 on the back side of the partition wall. The back of the partition wall is a sealed compartment and contains interconnections between the main frame connectors and incoming cables. Boxes 11 containing electronic devices, such as PBA's, are fastened to the main frame connectors 10 on the front side of the partition wall 9 and sealed to the partition wall by means of an elastic material, such as an O-ring.

The boxes 11 are cooled, when they dissipate heat, by a flow of air in through the ventilation louvers 4, upwards between the boxes 11 and out through the top slit 5. This assembly is designed to be placed outdoors which means exposure to solar rays, rain and other types of weather conditions. This requires that the connections and the electronic devices in the boxes must be protected from the outside environment.

FIGS. 2a–2c show views of a first preferred embodiment. This box 11 is designed for high cooling performance and the surface area of the box is enlarged with cooling fins 12. The box comprises at least two main parts 13 and 14 and a separate back plane 19. A PBA is squeezed between the two main parts that are fastened together with some type of fastening devices, preferable screws 15 but other fastening means can be used, for example glue or rivets. The front plane 16 of the box can be equipped with apertures for connectors 17, for example test ports and indicators 18 if so is desired. The back plane 19 of the box is equipped with at least one opening for a connector 20 from the PBA, called PBA-connector. The PBA-connector is plugged in to the main frame connector 10 during normal operation of the assembly and the back plane is sealed to the partition wall using an elastic material, for example an O-ring.

The design of the heat dissipating box 11 can be adjusted for low heat dissipating PBA's, where the need to enlarge the surface area is less. This type of box comprises at least two plain main parts, without the cooling fins, that are fastened together in a similar way as described in FIGS. 2a–2c and the same type of back plane for the PBA-connectors. The box can also be equipped with the same apertures for test ports and indicators on the front plane.

Figure 3:
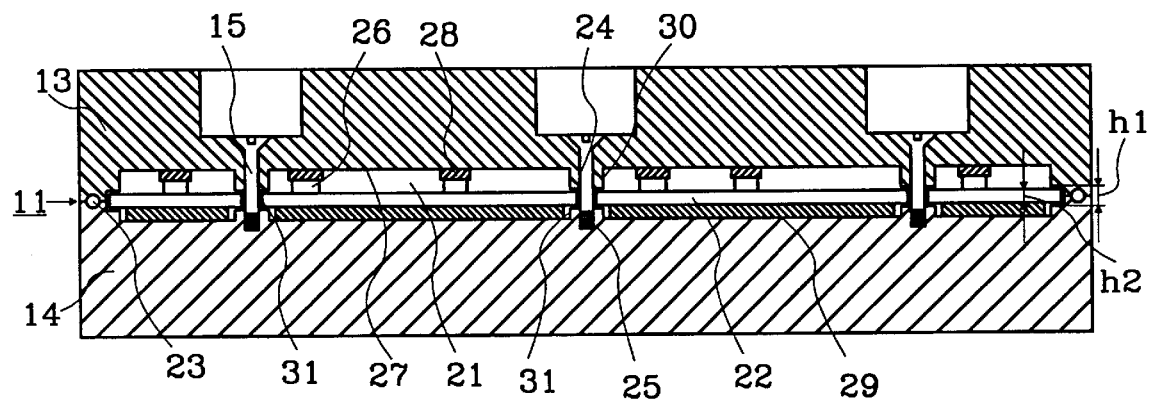
FIG. 3 is a cross-sectional view of the heat dissipating box in FIG. 2b, section A—A.

FIG. 3 shows a cross-sectional view of a heat dissipating box 11, section A—A FIG. 2b. A first part 14 and a second part 13 forms a cavity 21, where a PBA 22 is mounted. The edge of the PBA is placed in a niche 33, see FIG. 4, created by the main parts 13 and 14 and the height h1 of the niche must be greater than the thickness h2 of the PBA's printed circuit board. The joint between the main parts are sealed with an elastic material 23, which protects the cavity 21 and the PBA 22 from the outside environment.

The first and second parts are fastened together by screws 15, where each screw is placed through a drilled hole 24 in the second part 13, through an aperture in the PBA and fastened in a threaded hole 25 in the first part 14. The holes 24 and 25 are drilled through second supports 30 and into first supports 31, where the hole is threaded. The first and second supports prevents the PBA from deforming when the screws are tightened. A close contact between the supports 30 and 31 and the PBA enhances the possibility to conduct heat from the PBA's circuit board. This can be difficult to obtain due to variations in manufacture of the main parts 13 and 14.

The PBA 22 comprises heat dissipating electronic components 26 mounted on at least one side of the board, the primary side, and to get a good thermal contact between the components 26 and the inside of the cavity 27 a gap-filler 28 can be used. Large gap-fillers 29 may also be used to dissipate heat from the secondary side of the PBA. One type of gap-filler is a silicon gap-filler and an other type is a copper gap-filler.

Figure 4:
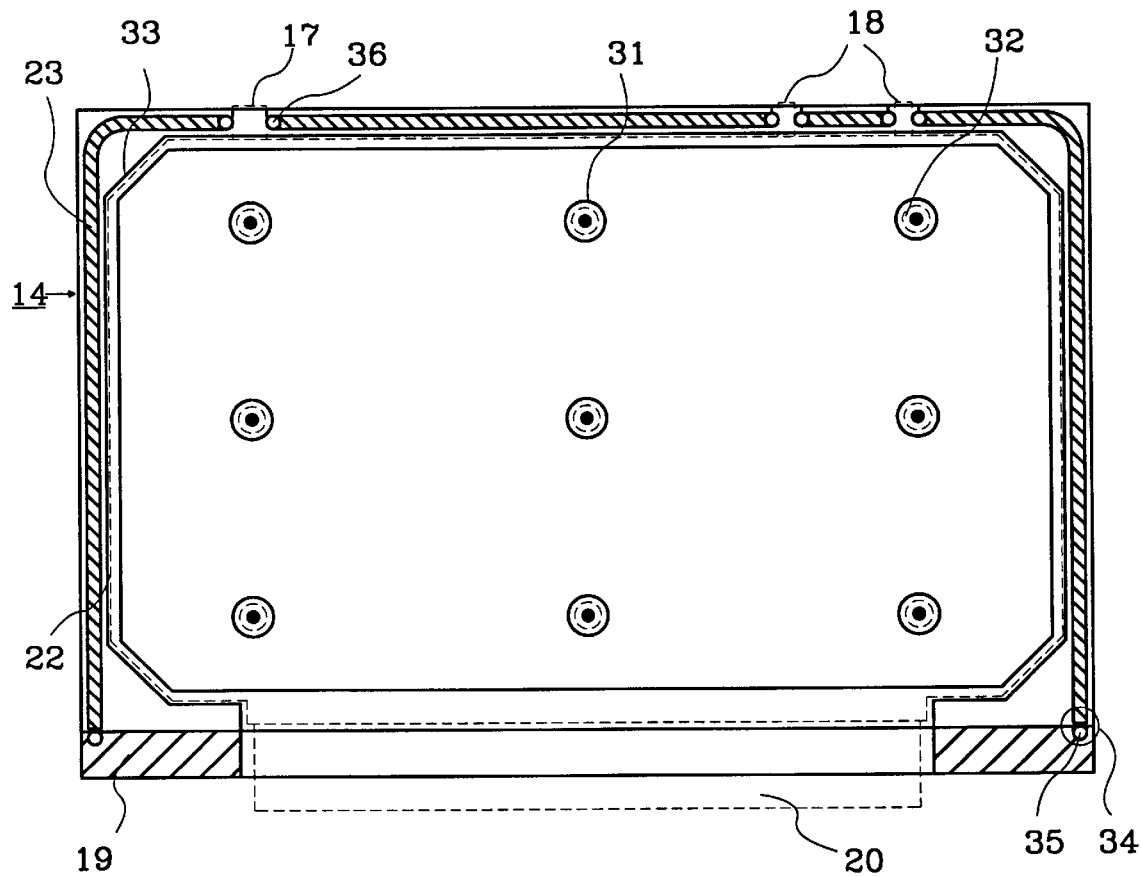
FIG. 4 is a top view of a first part of the same heat dissipating box as shown in FIG. 3.

FIG. 4 shows a top view of the first part 14 together with a cross-sectional view of a mounted back plane 19 of the heat dissipating box in FIG. 3. The first supports 31 are placed inside the cavity 21 to uniformly squeeze the first and second parts together.

An elastic material 23 is placed around three sides of the cavity in a groove and is adjusted to seal apertures for eventual test ports 17 and indicators 18 using for example elastic o-rings 36. The fourth side is sealed with an elastic material 35 when the back plane 19 is mounted. Small gaps 34 will appear between the elastic material around the cavity 23 and the elastic material in the back plane 35. These gaps are used to lead humidity created inside the cavity out to the ambient area. The PBA 22 is outlined in the figure, with the dashed line, including apertures 32, which are smaller than the size of the top of the first supports 31.

Figure 5:
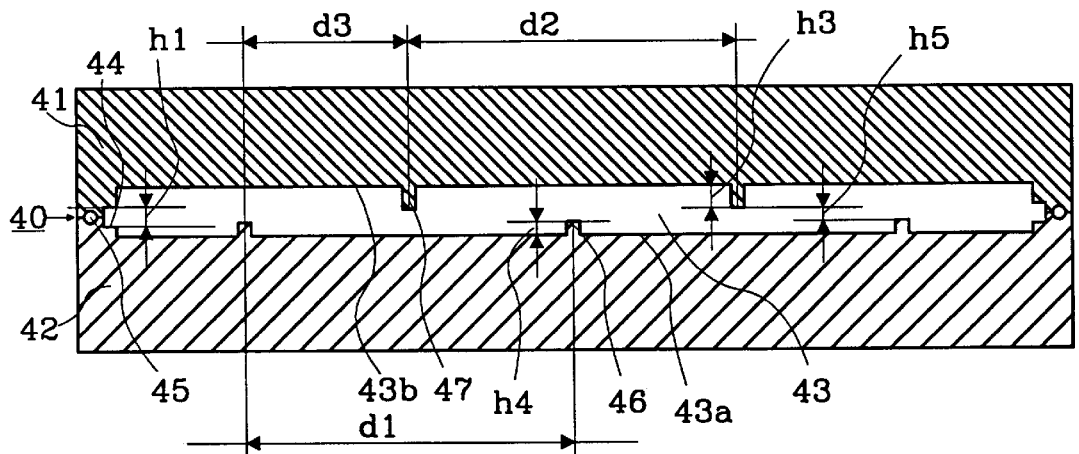
FIG. 5 is a cross-sectional view of an alternative heat dissipating box according to the invention.

FIG. 5 shows a cross-sectional view of a second preferred embodiment of a heat dissipating box 40. A first part 42 and a second part 41 forms a cavity 43, where a PBA is mounted, not shown in the figure. The edge of the PBA is placed in a niche 44 created by the main parts 41 and 42 and the height h1 of the niche must be greater than the thickness of the PBA's printed circuit board. The joint between the main parts is sealed with an elastic material 45, which protects the cavity 43 and the PBA from the outside environment.

The parts are fastened together by using at least four screws, not shown in the figure. The PBA is squeezed between rows of bumps, where each of said rows consists of at least one ridge 46 and 47. The rows are parallel and are placed on the first 43a and second 43b surface of the cavity and are extending in a first direction perpendicular to the back plane 19. The height h3 and h4 of each ridge extends from the first and second surface of the cavity towards the centre of the cavity in a second direction which is perpendicular to the first direction and the direction of the back plane.

There are at least three rows of first ridges 46 placed on the first surface 43a of the cavity 43 with an intermediate distance d1 in a third direction parallel to the direction of the back plane. The second surface 43b of the cavity has at least two rows of second ridges 47 with an intermediate distance d2 in the third direction. The first and second ridges must be dislocated a distance d3 in the third direction when the first and second parts are positioned on top of each other. The distance d2 is preferable equal to:

$d2=d1$, and the distance d3 is preferable equal to:

$d3=d2/2$.

The height of the ridges is adjusted so that the intermediate distance h5 in the second direction, between the tops of the first and second ridge is less than the minimum thickness of the PBA's printed circuit board and greater than:

$h5 > $ minimum thickness$-d3/200$.

A lesser distance can cause the PBA to be damaged from the pressure of the ridges.

For example: One type of standard PBA has a length of 265 mm and for that kind of PBA the intermediate distance d2 between the ridges is selected to be 75 mm and the intermediate distance d3 between the first and second rows of ridges is selected to be 75 mm/2=37.5 mm. If the minimum thickness of the PBA's printed circuit board is 1.8 mm the distance h5 between the tops of the ridges is equal to: h5=1.6125.

No apertures are needed in the PBA for fastening the PBA inside the cavity, but there is a need to design a component layout on the circuit board in a way that permits the ridges in the cavity to be in contact with the PBA. A close contact between the ridges and the PBA enhances the possibility to conduct heat from the PBA's circuit board without using any kind of gap-fillers and an even better conductivity can be obtained if the ridges are in contact with the conductive pattern and connected to for example earth potential.

Figure 6:
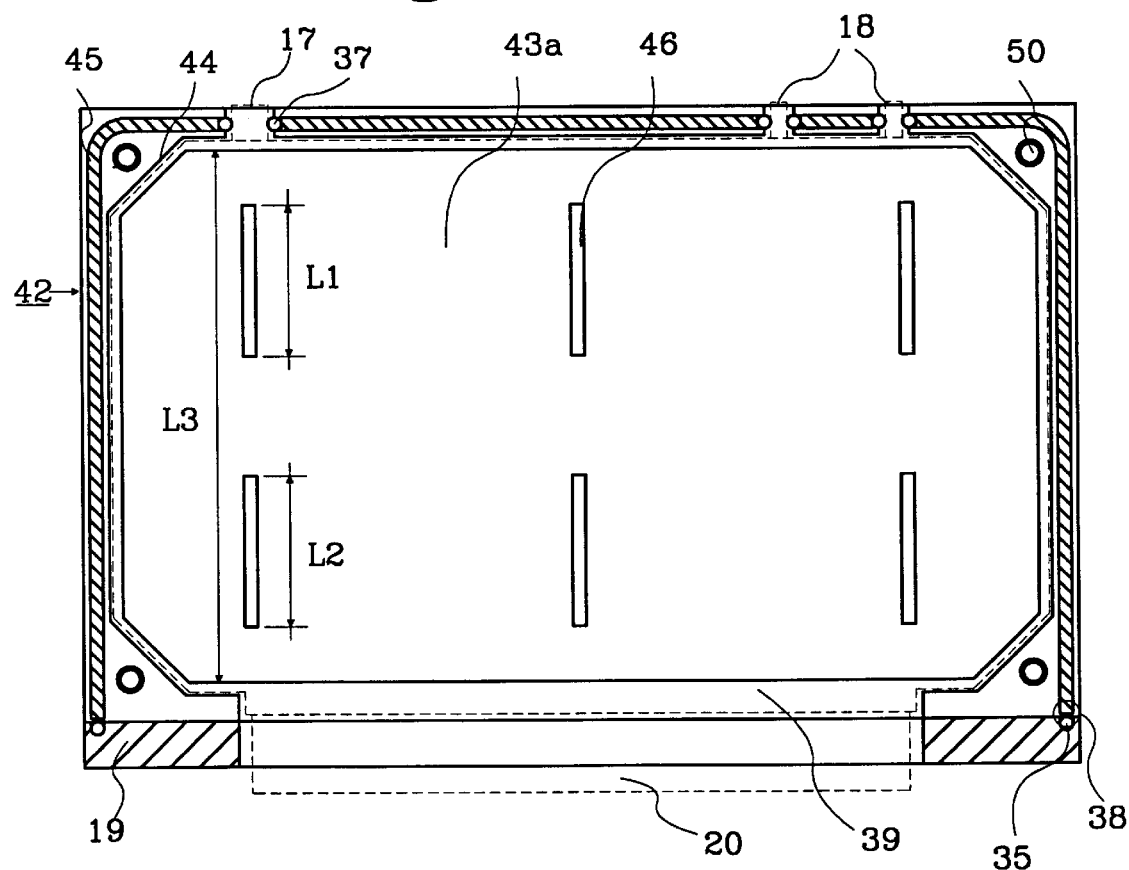
FIG. 6 is a top view of a first part of the same heat dissipating box as shown in FIG. 5.

FIG. 6 shows a top view of the first part 42 together with a cross-sectional view of a mounted back plane 19 of the heat dissipating box in FIG. 5. The ridges 46 are placed in parallel rows on the first surface 43a of the cavity in the first direction perpendicular to the back plane 19 of the box. The total length (L1+L2) of the ridges in a row must be equal to or exceed 50% of the inside distance L3 of the cavity in the same direction. The first part also include at least four threaded holes 50 to fasten the first and second part of the box with screws or a similar fastening device.

An elastic material 45 is placed around three sides of the cavity in a groove and is adjusted to seal apertures for eventual test ports 17 and indicators 18 using for example elastic o-rings 37. The fourth side is sealed with an elastic material 35 when the back plane 19 is mounted. Small gaps 38 will appear between the elastic material 45 around the cavity and the elastic material in the back plane 35. These gaps are used to lead humidity created inside the cavity out to the ambient area. The PBA 39 with the PBA-connector 20 is outlined in the figure, with the dashed lines.

Figure 7:
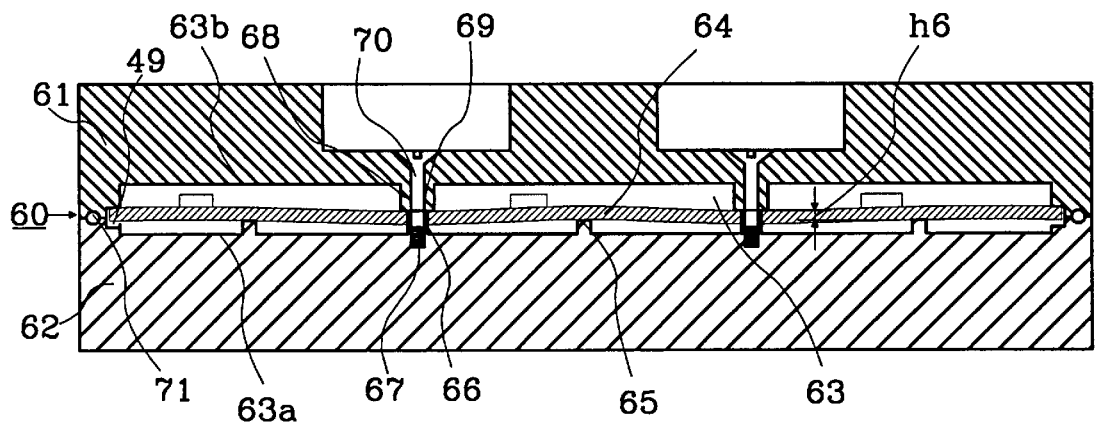
FIG. 7 is a cross-sectional view of a combined heat dissipating box, according to the invention.

FIG. 7 shows a cross-sectional view of a third preferred embodiment of a heat dissipating box 60. A first part 62 and a second part 61 forms a cavity 63, where a PBA 64 is mounted. This embodiment is a combination of the two previous described embodiments.

The first part 62 has at least three rows of a first type of bumps 65 and at least two rows of a second type of bumps 66. The first type of bumps, described in the second embodiment, comprises at least one ridge 65. The second type of bumps, described in the first embodiment, comprises at least three first supports 66, which contains a threaded hole 67. The rows are all parallel and the rows with the first supports 66 are placed between the rows of the ridges 65 extending in a first direction perpendicular to the direction of the back plane and on the cavity's first surface 63a.

The second part 61 has at least two rows comprising at least three second supports 68 containing a drilled hole 69, described in the first embodiment. A difference from the previously described first embodiment is that the second supports have a larger top area compared to the first supports top area, and the tops of the supports coincide when the second part 61 and first part 62 are fastened together. Screws 70 are mounted through the hole 69 in the second part and fastened in the threaded part 67 in the first part.

The PBA 64 is placed between the rows of bumps 65 and 66 and in a niche 49. The PBA's printed circuit board is squeezed in the same way as described in the second preferred embodiment, where the ridges on the second surface are replaced with the first and second supports with an intermediate distance h6 calculated the same way as for the intermediate distance h5 in the second preferred embodiment.

Figure 8:
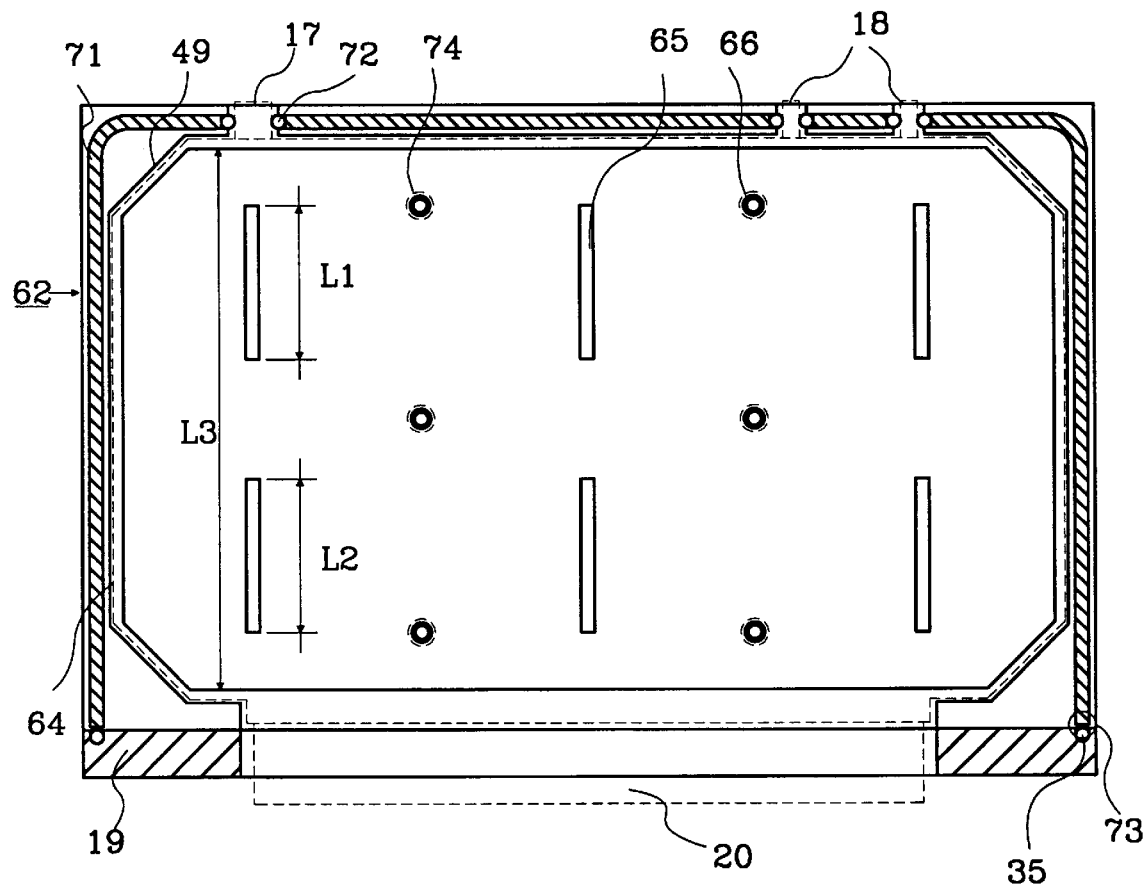
FIG. 8 is a top view of a first part of the same heat dissipating box as shown in FIG. 7.

FIG. 8 shows a top view of the first part 62 together with a cross-sectional view of a mounted back plane 19 of the heat dissipating box in FIG. 7. The ridges 65 are placed in parallel rows inside the cavity 63 in the first direction perpendicular to the back plane 19 of the box. The total length of the ridges in a row must be equal to or exceed 50% of the inside distance of the cavity in the same direction as previously described in FIG. 6.

The first part also comprises two rows of first supports 66 with the threaded hole 67 to fasten the first and second part of the box with screws 70 or a similar fastening device.

An elastic material 71 is placed around three sides of the cavity in a groove and is adjusted to seal apertures for eventual test ports 17 and indicators 18 using for example elastic o-rings 72. The fourth side is sealed with an elastic material 35 when the back plane 19 is mounted. Small gaps 73 will appear between the elastic material 71 around the cavity and the elastic material in the back plane 35. These gaps are used to lead humidity created inside the cavity out to the ambient area. The PBA 64 is outlined in the figure, with the dashed line, including apertures 74, which are larger than the size of the top of the first supports 66. It is essential that the second supports does not pass through the PBA to establish the squeezing effect that will create the thermal contact between the PBA and the main part via the bumps.

This design has a big advantage compared to the other described embodiments. The demanded space for the supports on the primary side of the PBA is less, which means that there is a larger area where the components of the PBA can be mounted.

A PBA that is encapsulated in a heat dissipating box according to the invention can obtain a heat dissipation up to 5 times greater compared with a PBA without any enclosure or cooling fins. If the box is plain, which means no cooling fins, this effect is reduced 2–3 times.

We claim:

1. A heat dissipating box for at least one printed board assembly (PBA), where the heat dissipating box comprises at least two main parts, a first part and a second part, creating a cavity, in which the PBA is mounted and where a joint between said parts is sealed by using an elastic material and a back plane mounted to the two main parts sealing the cavity by using an elastic material between said main parts and the back plane, characterised in that surfaces of the cavity (21,43,63), created by said first part (14,42,62), the first surface (43a,63a), and said second part (13,41,61), the second surface (27,43b,63b), has bumps (30,31,46,47,65,66, 68) to achieve a good thermal contact between the mounted PBA (22,39,64) in the box (11,40,60) and the surfaces of the cavity (21,43,63) inside the box.

2. A heat dissipating box according to claim 1, characterised in that a niche (23,44,49) is created by said first (14,42,62) and second part (13,41,61) on at least two opposite sides of said cavity (21,43,63) where the PBA's edge is placed when mounted.

3. A heat dissipating box according to claim 1, characterised in that the main parts (13,41,61;14,42,62) have cooling fins (12) on the outside.

4. A heat dissipating box according to claim 1, characterised in that the main parts (13,41,61;14,42,62) are fastened to each other by screws (15,70) so that the PBA (22,39,64) is squeezed between the main parts to establish the thermal contact between the PBA (22,39,64) and the bumps on the inside of the cavity (21,43,63).

5. A heat dissipating box according to claim 1, characterised in that the bumps (30,31,46,47,65,66,68) in the cavity (21,43,63) of each main part are placed in parallel rows.

6. A heat dissipating box according to claim 5, characterised in that the parallel rows of bumps (65,66,68) in the cavity (63) are placed in a first direction and the height of the bumps are extended in a second direction perpendicular to the first direction, and the bumps are divided into two types, a ridge type and a first and second support type, where the length (L1, L2) of a ridge is extended in the first direction and the supports mainly are extended in the second direction.

7. A heat dissipating box according to claim 6, characterised in that the first part (62) has at least three rows of the ridge type bumps, where said rows each comprises at least one ridge (65), and at least two rows of the support type bumps, where said rows each comprises at least three first supports (66), and each of said rows of the support type is placed between two rows of the ridge type.

8. A heat dissipating box according to claim 7, characterised in that the second part (61) has at least two rows of the support type bumps, where said rows each comprises at least three second supports (68) which coincide with the first supports (66) placed in the first part (62).

9. A heat dissipating box according to claim 6, characterised in that a hole (69) is drilled in the second direction through each support (68) in one of the main parts (61) and into the coinciding support (66) of the other main part (62) where the hole in said other main part is threaded, wherein the second supports (68) in the second part and the coinciding first supports (66) in the first part are in contact with each other when the main parts are mounted, and that the screws (70) are mounted in the drilled holes and tightened in the threaded part (67).

10. A heat dissipating box according to claim 9, characterised in that the PBA (64) has apertures (74) coinciding with the supports (66,68) in the cavity (63), where the opening of said apertures is larger than the first support (66) in the first part (62), but smaller than the second support (68) in the second part (61).

11. A heat dissipating box according to claim 10, characterised in that a distance (h6), in the second direction, between the top of the ridge in the first part and the top of the second support in the second part is less than the thickness of the PBA's printed circuit board.

12. A heat dissipating box according to claim 10, characterised in that the parallel rows of bumps (65,66,68) in the cavity (63) are approximately equally spaced in a third direction, perpendicular to both the first and second direction.

13. A heat dissipating box according to claim 5, characterised in that the parallel rows of bumps (46,47) in the cavity (43) are placed in a first direction and the height (h3,h4) of the bumps are extended in a second direction perpendicular to the first direction, and the bumps are of a first and second ridge type, where the length (L) of a ridge is extended in the first direction.

14. A heat dissipating box according to claim 13, characterised in that the first part (42) has at least three rows of the ridge type bumps, where said rows each comprises at least one first ridge (46).

15. A heat dissipating box according to claim 13, characterised in that the second part (41) has at least two rows of the ridge type bumps, where said rows each comprises at least one second ridge (47).

16. A heat dissipating box according to claim 14, characterised in that at least one hole is drilled in the second direction, through each corner of one of the main parts (41), outside the cavity (43), and into the other main part (42) where the hole in said other main part is threaded (50).

17. A heat dissipating box according to claim 16, characterised in that the height of each ridge extends from the first (43a) respectively the second (43b) surface of the cavity (43) towards the centre of the cavity in the second direction, so that an intermediate distance (h5) between the top of the first ridge (46) and the top of the second ridge (47) is less than the minimum thickness of a printed circuit board of the PBA.

18. A heat dissipating box according to claim 16, characterised in that the parallel rows of the ridges in the cavity (43) are approximately equally spaced (d1,d2) in a third direction, perpendicular to both the first and second direction, and the first and second ridges are dislocated a distance (d3) in the third direction, when the first and second parts are positioned on top of each other.

19. A heat dissipating box according to claim 6, characterised in that the total length (L1+L2) of the ridges in a row must be equal to or exceed 50% of the inside distance (L3) of the cavity (43,63) in the first direction.

20. A heat dissipating box according to claim 1, characterised in that the box (11,40,60) is placed in an assembly (1) for mounting electronic devices in a hostile environment, wherein said assembly is cooled by utilising natural convection.

\* \* \* \* \*